US007886204B2

(12) United States Patent  (10) Patent No.: US 7,886,204 B2
Gonzalez et al.  (45) Date of Patent: *Feb. 8, 2011

(54) METHODS OF CELL POPULATION DISTRIBUTION ASSISTED READ MARGINING

(75) Inventors: Carlos J. Gonzalez, Los Gatos, CA (US); Daniel C. Guterman, Fremont, CA (US)

(73) Assignee: SanDisk Corporation, Milpitas, CA (US)

(*) Notice: Subject to any disclaimer, the term of this patent is extended or adjusted under 35 U.S.C. 154(b) by 1128 days.

This patent is subject to a terminal disclaimer.

(21) Appl. No.: 11/535,853

(22) Filed: Sep. 27, 2006

(65) Prior Publication Data

US 2008/0077841 A1  Mar. 27, 2008

(51) Int. Cl.
*G11C 11/4193* (2006.01)
*G11C 16/28* (2006.01)

(52) U.S. Cl. .............. 714/709; 365/189.07; 365/189.09

(58) Field of Classification Search ................ 714/709, 714/763; 365/189.07, 189.09
See application file for complete search history.

(56) References Cited

U.S. PATENT DOCUMENTS

| 4,139,911 A | 2/1979 | Sciulli et al. |
| 4,218,764 A | 8/1980 | Furuta et al. |
| 4,253,059 A | 2/1981 | Bell et al. |
| 4,460,982 A | 7/1984 | Gee et al. |
| 4,612,630 A | 9/1986 | Rosier |
| 4,694,454 A | 9/1987 | Matsuura |
| 4,703,196 A | 10/1987 | Arakawa |
| 4,703,453 A | 10/1987 | Shinoda et al. |
| 4,733,394 A | 3/1988 | Giebel |
| 4,763,305 A | 8/1988 | Kuo |
| 4,779,272 A | 10/1988 | Kohda et al. |
| 4,799,195 A | 1/1989 | Iwahashi et al. |
| 4,809,231 A | 2/1989 | Shannon et al. |
| 4,827,450 A | 5/1989 | Kowalski |
| 4,937,787 A | 6/1990 | Kobatake |
| 4,962,322 A | 10/1990 | Chapman |
| 4,964,079 A | 10/1990 | Devin |
| 4,975,883 A | 12/1990 | Baker et al. |
| 4,980,859 A | 12/1990 | Guterman et al. |
| 5,043,940 A | 8/1991 | Harari |

(Continued)

FOREIGN PATENT DOCUMENTS

EP  97460009.0  2/1997

(Continued)

OTHER PUBLICATIONS

Notification of Transmittal of the International Search Report and the Written Opinion of the International Searching Authority, or the Declaration for Application No. PCT/US2007/079062, mailed May 7, 2008, 12 pages.

(Continued)

*Primary Examiner*—Guy J Lamarre
(74) *Attorney, Agent, or Firm*—Davis Wright Tremaine LLP

(57) ABSTRACT

A memory using techniques to extract the data content of its storage elements, when the distribution of stored states is degraded, is presented. If the distribution of stored states has degraded, secondary evaluations of the memory cells are performed using modified read conditions. Based upon the results of these supplemental evaluations, the memory device determines the read conditions at which to best decide the data stored.

17 Claims, 2 Drawing Sheets

U.S. PATENT DOCUMENTS

| | | | |
|---|---|---|---|
| 5,052,002 A | 9/1991 | Tanagawa |
| 5,065,364 A | 11/1991 | Atwood et al. |
| 5,070,032 A | 12/1991 | Yuan et al. |
| 5,095,344 A | 3/1992 | Harari |
| 5,119,330 A | 6/1992 | Tanagawa |
| 5,122,985 A | 6/1992 | Santin |
| 5,132,928 A | 7/1992 | Hayashikoshi et al. |
| 5,132,935 A | 7/1992 | Ashmore, Jr. |
| 5,151,906 A | 9/1992 | Sawada |
| 5,157,629 A | 10/1992 | Sato et al. |
| 5,172,338 A | 12/1992 | Mehrotra et al. |
| 5,172,339 A | 12/1992 | Noguchi et al. |
| 5,200,922 A | 4/1993 | Rao |
| 5,200,959 A | 4/1993 | Gross et al. |
| 5,239,505 A | 8/1993 | Fazio et al. |
| 5,262,984 A | 11/1993 | Noguchi et al. |
| 5,263,032 A | 11/1993 | Porter et al. |
| 5,270,551 A | 12/1993 | Kamimura et al. |
| 5,270,979 A | 12/1993 | Harari et al. |
| 5,278,794 A | 1/1994 | Tanaka et al. |
| 5,313,421 A | 5/1994 | Guterman et al. |
| 5,313,427 A | 5/1994 | Schreck et al. |
| 5,321,655 A | 6/1994 | Iwahashi et al. |
| 5,327,383 A | 7/1994 | Merchant et al. |
| 5,335,198 A | 8/1994 | Van Buskirk et al. |
| 5,341,334 A | 8/1994 | Maruyama |
| 5,343,063 A | 8/1994 | Yuan et al. |
| 5,347,489 A | 9/1994 | Mechant et al. |
| 5,365,486 A | 11/1994 | Schreck |
| 5,377,147 A | 12/1994 | Merchant et al. |
| 5,394,359 A | 2/1995 | Kowalski |
| 5,404,485 A | 4/1995 | Ban |
| 5,450,363 A | 9/1995 | Christopherson et al. |
| 5,465,236 A | 11/1995 | Naruke |
| 5,475,693 A | 12/1995 | Christopherson et al. |
| 5,504,760 A | 4/1996 | Harari et al. |
| 5,523,972 A | 6/1996 | Rashid et al. |
| 5,530,705 A | 6/1996 | Malone, Sr. |
| 5,532,962 A | 7/1996 | Auclair et al. |
| 5,570,315 A | 10/1996 | Tanaka et al. |
| 5,583,812 A | 12/1996 | Harari |
| 5,621,682 A | 4/1997 | Tanzawa et al. |
| 5,648,934 A | 7/1997 | O'Toole |
| 5,652,720 A | 7/1997 | Aulas et al. |
| 5,657,332 A | 8/1997 | Auclair et al. |
| 5,661,053 A | 8/1997 | Yuan |
| 5,675,537 A | 10/1997 | Bill et al. |
| 5,689,465 A | 11/1997 | Sukegawa et al. |
| 5,703,506 A | 12/1997 | Shook et al. |
| 5,712,815 A | 1/1998 | Bill et al. |
| 5,715,193 A | 2/1998 | Norman |
| 5,717,632 A | 2/1998 | Richart et al. |
| 5,751,639 A | 5/1998 | Ohsawa |
| 5,761,125 A | 6/1998 | Himeno |
| 5,774,397 A | 6/1998 | Endoh et al. |
| 5,798,968 A | 8/1998 | Lee et al. |
| 5,835,413 A | 11/1998 | Hurter et al. |
| 5,889,698 A | 3/1999 | Miwa et al. |
| 5,890,192 A | 3/1999 | Lee et al. |
| 5,905,673 A | 5/1999 | Khan |
| 5,909,449 A | 6/1999 | So et al. |
| 5,930,167 A | 7/1999 | Lee et al. |
| 5,937,425 A | 8/1999 | Ban |
| 5,963,473 A | 10/1999 | Norman |
| 6,046,935 A | 4/2000 | Takeuchi et al. |
| 6,145,051 A | 11/2000 | Estakhri et al. |
| 6,151,246 A | 11/2000 | So et al. |
| 6,199,139 B1 | 3/2001 | Katayama et al. |
| 6,215,697 B1 | 4/2001 | Lu et al. |
| 6,222,762 B1 | 4/2001 | Guterman et al. |
| 6,222,768 B1 | 4/2001 | Hollmer et al. |
| 6,345,001 B1 | 2/2002 | Mokhlesi |
| 6,415,352 B1 | 7/2002 | Asami et al. |
| 6,426,893 B1 | 7/2002 | Conley et al. |
| 6,456,528 B1 | 9/2002 | Chen |
| 6,522,580 B2 | 2/2003 | Chen et al. |
| 6,560,152 B1 | 5/2003 | Cernea |
| 6,567,307 B1 | 5/2003 | Estakhri |
| 6,678,785 B2 | 1/2004 | Lasser |
| 6,728,134 B2 | 4/2004 | Ooishi |
| 6,760,255 B2 | 7/2004 | Conley et al. |
| 6,763,424 B2 | 7/2004 | Conley |
| 6,772,274 B1 | 8/2004 | Estakhri |
| 6,807,101 B2 | 10/2004 | Ooishi et al. |
| 6,839,281 B2 | 1/2005 | Chen et al. |
| 6,912,160 B2 | 6/2005 | Yamada |
| 6,925,007 B2 | 8/2005 | Harari et al. |
| 6,963,505 B2 | 11/2005 | Cohen |
| 7,012,835 B2 | 3/2006 | Gonzalez et al. |
| 7,076,598 B2 | 7/2006 | Wang |
| 7,224,607 B2 | 5/2007 | Gonzalez et al. |
| 7,224,611 B2 * | 5/2007 | Yamamoto et al. ..... 365/185.21 |
| 7,242,618 B2 | 7/2007 | Shappir et al. |
| 7,254,071 B2 | 8/2007 | Tu et al. |
| 7,257,025 B2 | 8/2007 | Maayan et al. |
| 7,286,412 B1 | 10/2007 | Chen |
| 7,330,376 B1 | 2/2008 | Chen et al. |
| 7,450,425 B2 | 11/2008 | Aritome |
| 7,489,549 B2 | 2/2009 | Mokhlesi |
| 7,518,919 B2 | 4/2009 | Gonzalez et al. |
| 7,613,043 B2 | 11/2009 | Cornwell et al. |
| 7,630,254 B2 | 12/2009 | Lutze |
| 7,716,538 B2 * | 5/2010 | Gonzalez et al. ............ 714/709 |
| 2002/0048202 A1 | 4/2002 | Higuchi |
| 2003/0086293 A1 | 5/2003 | Gongwer et al. |
| 2003/0109093 A1 | 6/2003 | Harari et al. |
| 2005/0073884 A1 | 4/2005 | Gonzalez et al. |
| 2006/0039196 A1 | 2/2006 | Gorobets et al. |
| 2006/0062048 A1 | 3/2006 | Gonzalez et al. |
| 2006/0233023 A1 | 10/2006 | Lin et al. |
| 2007/0211532 A1 | 9/2007 | Gonzalez et al. |
| 2008/0158968 A1 | 7/2008 | Moogat et al. |
| 2008/0158969 A1 | 7/2008 | Moogat et al. |

FOREIGN PATENT DOCUMENTS

| | | |
|---|---|---|
| EP | 0791933 | 8/1997 |
| GB | 2289779 | 11/1995 |
| JP | 8-077785 | 3/1996 |
| JP | 8-147988 | 6/1996 |
| JP | 8-279295 | 10/1996 |
| JP | 8-297987 | 11/1996 |
| JP | 09-128165 | 5/1997 |
| JP | 9-306182 | 11/1997 |
| JP | 2000-187992 | 7/2000 |
| WO | WO 9012400 | 10/1990 |
| WO | WO 01/08015 | 2/2001 |
| WO | WO 02/058074 | 7/2002 |
| WO | WO2005/036401 | 4/2005 |
| WO | WO2005/041107 | 5/2005 |

OTHER PUBLICATIONS

Lee et al., "Error Correction Technique for Multivalued MOS Memory," *Electronic Letters*, vol. 27, No. 15, Jul. 18, 1991, pp. 1321-1323.

Communication pursuant to Article 94(3) EPC, Euporean Application No. 07 842 895.0 dated Sep. 16, 2009, 2 pages.

* cited by examiner

METHODS OF CELL POPULATION DISTRIBUTION ASSISTED READ MARGINING

CROSS-REFERENCE TO RELATED APPLICATION

The present application is related to U.S. application Ser. No. 11/535,879, now U.S. Pat. No. 7,716,538, entitled "Memory with Cell Population Distribution Assisted Read Margining," by Carlos J. Gonzalez and Daniel C. Guterman, filed Sep. 27, 2006, and incorporated herein in its entirety by this reference.

BACKGROUND OF THE INVENTION

The present invention relates generally to reading the data content of non-volatile and other memory devices, and, more particularly, to using information on the distribution of program levels of a memory cell populations to more accurately read the content of degraded distributions.

As flash and other memory devices migrate to smaller geometries, the influence of a number of phenomena that negatively impact the robustness of data storage increases. Included in these factors are over-programming, read and program disturb, and data retention issues. These problems are often further aggravated as the number of states per cell is increased and as the operating window of stored threshold voltages shrinks. These factors are generally accounted for in the design phase of the memory devices through various tradeoffs that can be made within the design. These tradeoffs may increase or decrease the influence of one or the other of these factors, and/or tradeoff some of these factors against others, such as performance, endurance, reliability, and so on. In addition to tradeoffs within the memory design, there are a number of system-level mechanisms that may be incorporated to compensate for these phenomena, where needed, to achieve product-level specifications. These system mechanisms include ECC, wear-leveling, data refresh (or "Scrub"), and read margining (or "Heroic Recovery"), such as are discussed in U.S. Pat. Nos. 7,012,835, 6,151,246 and, especially, U.S. Pat. No. 5,657,332.

The above phenomena generally have the impact of affecting the distribution of cell voltage thresholds, either during programming, during subsequent memory operations, or over time, and they generally have a larger impact in multi-state memory storage relative to binary memory storage. The impact is typically to spread the voltage threshold levels of a given memory state within a population of cells, and, in some cases, to shift cell threshold levels such that they read in an erroneous state under normal read conditions, in which case the data bits for those cells become erroneous. As memories having smaller geometries become integrated into storage products, it is expected that the memory-level tradeoffs required to overcome the anticipated memory phenomena will make it difficult to achieve the required product-level specifications. Consequently, improvements to these devices will be required.

SUMMARY OF THE INVENTION

The present invention presents a memory device and methods of determining its data content. The memory cells of the device are evaluated at a first reference condition and a plurality of secondary reference conditions. Based on comparing the number of memory cells evaluated at the first reference condition and the second reference conditions, the memory device establishes a read condition for a data state based on the rate of change of number of memory cells evaluated at the plurality of reference conditions.

In some embodiments, the evaluations of the memory cells using a plurality of secondary read conditions is performed in response to determining that an evaluation using standard read conditions has an unacceptable level of error. Information on the distribution of programmed state populations of the memory cells is extracted based on the results of the evaluations using the standard read conditions and the plurality of secondary read conditions. Modified read conditions, which differ from the standard read conditions, are determined at which to evaluate the memory cells to determine their data content based on the information on the distribution of programmed state populations.

Additional aspects, advantages and features of the present invention are included in the following description of exemplary examples thereof. All patents, patent applications, articles, books, specifications, other publications, documents and items referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

BRIEF DESCRIPTION OF THE DRAWINGS

The invention may best be understood by reference to the following description taken in conjunction with the accompanying drawings in which.

DETAILED DESCRIPTION OF EXEMPLARY EMBODIMENTS

Figure 1:
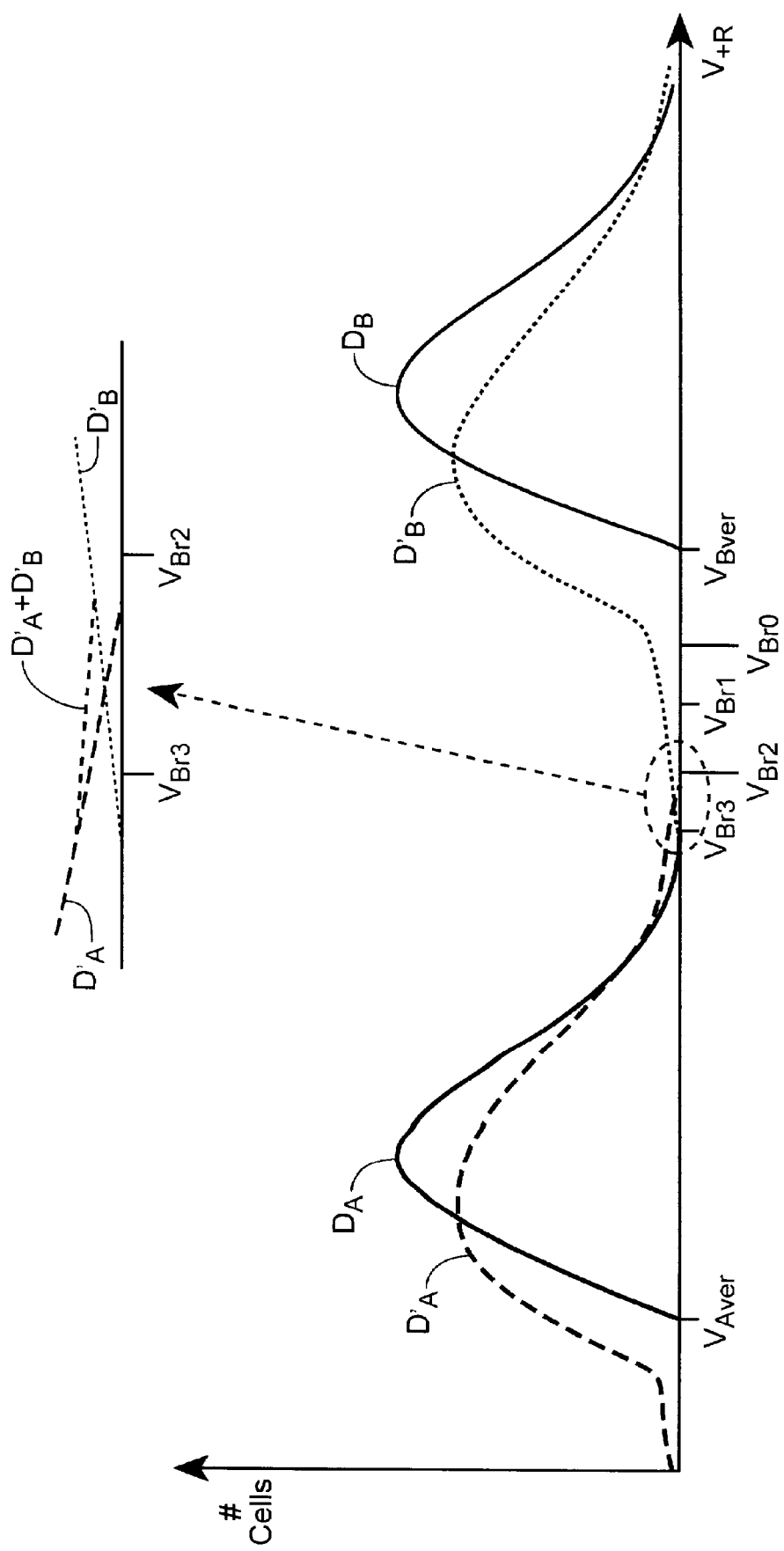
FIG. 1 shows an example of a degraded distribution of programmed memory states.

The present invention is related to reading the data content of memory systems. When data, whether stored in either binary or multi-state per memory cell form, is programmed into a memory, the population of individual cells programmed to a given state will form distributions around the desired values of the parameter corresponding to the respective storage states. For example, in the case of a flash memory, its threshold voltage characterizes a particular data state. If a data state corresponds to a threshold voltage of, say, 2 volts, the cells programmed to this state will not all end up at exactly 2.0 volts, but rather be spread out over a distribution mostly above the corresponding program verify level for that state. Although at the time of programming the distributions corresponding to the data states may be well defined and clearly separated, over time and operating history the distributions may spread. This degradation can lead to misreading of data as the read conditions that are used to distinguish one state from another may no longer correctly read the state of a cell whose threshold value has shifted too far.

As discussed in the Background section, as size of memory devices become ever smaller, use lower operating voltages, and store more states per memory cell, the influence of various phenomena that negatively impact the robustness of data storage increases. These factors include over-programming, read and program disturb, data pattern/history influences and data retention issues associated with a given memory technology. These factors are generally accounted for in the design phase of the flash and other memory devices, with a number of tradeoffs made within the design that may increase or decrease the influence of one or the other and/or that tradeoff some of these factors against others, such as performance, endurance, reliability, and so on. Beyond the tradeoffs inherent in a given memory design, there are a number of system-level mechanisms that may be designed-in to compensate for these phenomena where needed to achieve product-level specifications. These system mechanisms include error correction code (ECC), wear-leveling, data refresh (or "scrubbing"), and read margining (or "heroic recovery").

Such previous methods, along with appropriate structures, are described in U.S. Pat. No. 5,657,332, which is fully incorporated herein and referenced in many locations, can be considered as base embodiments of circuitry and other memory device elements upon which the various aspects of the present invention can be incorporated. When reference to a specific memory array embodiment is needed, the exemplary embodiment of the memory can be taken as a NAND type flash memory such as that described in U.S. Pat. Nos. 5,570,315, 5,903,495, and 6,046,935.

The various phenomena affecting the distribution generally have the impact of affecting the distribution of cells either during programming, during subsequent memory operations, or over time, and they generally have a larger impact in multi-state memory storage relative to binary memory storage. The impact is typically to spread the threshold voltage (or other applicable state parameter) in a population of cells within a given state, and in some cases, to shift cells' threshold voltage such that they read in an erroneous state under normal read conditions, in which case the data bits for those cells are erroneous.

A typical situation is illustrated schematically in FIG. 1. FIG. 1 shows the distribution of memory storage units versus the parameter, $V_{th}$, that defines differing memory state threshold voltage distributions, $D_A$ and $D_B$, for two corresponding data states, A and B, respectively. To make the example concrete, these can be taken as data states for cells of a flash memory, where the parameter is threshold voltage. The distributions for two states, A and B, are shown. These may be the only states in the case of a binary memory or two adjacent states of a multi-state memory. When these states are initially programmed, their associated threshold voltage levels are based on a set of verify levels, where all the cells of a given data state are programmed until their threshold voltage levels lie above the corresponding verify level. These initial post-programming distributions for the A and B states are shown as $D_A$ and $D_B$ and used corresponding verify points $V_{Aver}$ and $V_{Bver}$. Programming of a given cell in this memory example proceeds from lower voltage threshold levels to higher levels, and is normally terminated once it verifies successfully, so that the successfully programmed cells of a given state will typically lie above the verify level, the maximum of which is usually dictated by the amount of movement that results from one given programming pulse. Because some cells program relatively quickly compared to the mainstream cell population, and no provision is typically made for cells that programmed too quickly, this can lead to somewhat of a tail on the higher end of the threshold voltage distribution. Various programming techniques are known to improve the tightness of the distributions, some of which are described in U.S. Pat. Nos. 6,738,289, 6,621,742, and 6,522,580.

To read the data content of this memory, the verify points can then be used as read compare points, although typically a read point is shifted somewhat in the less programmed (lower voltage) direction to provide some safety margin. For instance, in FIG. 1 the point $V_{Br0}$ can be used as the normal read point to distinguish A states from B states. (In the case of a multi-state memory, it will actually distinguish states A and any lower states from state B and any higher states, wherein techniques for disentangling the various multi-states are familiar in the art.) Due to the various mechanisms mentioned above, the distributions $D_A$ and $D_B$ tend to degrade as shown schematically by the distributions $D'_A$ and $D'_B$. By placing $V_{Br0}$ somewhat lower than $V_{Bver}$, some allowance for the degradation is made; however, if too many cells have drifted below $V_{Br0}$, the capability of the ECC becomes overwhelmed, and the system cannot successfully extract the corresponding data content. $V_{Br0}$ could of course be moved further to the left, a still lower voltage level ("heroic recovery), but eventually such shifted reads will result in too many cells that properly belong to the A state to be misread as B state. Furthermore, following data write, some of the A states may possibly shift upward as the A distribution degrades via mechanisms listed above, thereby further aggravating the situation. (As discussed further below, although the discussion is presented here in terms of varying the compare point, keeping the compare point the same but changing the bias levels on a cell being read can alternately achieve the same end.)

With the integration of higher density memories into storage products, it is anticipated that the memory-level tradeoffs required to overcome the anticipated memory phenomena will make it more difficult still to achieve the required product-level specifications. One of the system-level mechanisms anticipated to provide a benefit to such products is the following type of read margining during read retries, referred to as "heroic recovery", which is employed upon detection of an uncorrectable ECC error under nominal read conditions. Heroic recovery consists of re-reading data during retries under shifted read bias conditions or shifted compare points, essentially changing the discrimination points between states, in an attempt to recover cells that read in the erroneous state under normal conditions to their proper state. Heroic Recovery has a few drawbacks that need to be overcome in order to provide the best benefit to the product. Because the storage system relies on ECC to detect erroneous bits, and because there is no independent indication of which direction cells may have shifted (such as a count of cells expected in each state), there is no way for the system to know the actual direction that the cells in erroneous states have in fact shifted. The bias conditions generally follow a pre-determined sequence, designed based on the expected influence of the shifting phenomena, which may be toward either the more programmed or more erased states. The actual direction of the shift experienced by the cells may be counter to expectations due to the fact that there are numerous independent influences. In the absence of safeguards, it is possible that the biasing of the read conditions may cause a large enough number of cells to be read in erroneous states so as to overwhelm the ECC capabilities. Once overwhelmed, the ECC algorithm may either fail to detect an ECC error (misdetection), or to erroneously "correct" the set of data bits (miscorrection), in either case leading to erroneous data being passed as good data.

Various approaches can be used to improve the robustness of the heroic recovery mechanism. One of these is the use of reference or tracking cells, such as are described in U.S. Pat. Nos. 5,172,338, 6,222,762 and 6,538,922. Under this arrangement, a number of cells are programmed to known (i.e. reference) states. During read retries, these cells can be read to a fine granularity, and their distribution used to estimate the main cell population. In this way excessive shifts from nominal are detected, information from which is then used to guide the heroic recovery bias conditions. This method has the drawback of requiring additional cells, which adds cost to each flash memory die. Additionally, because in practice the tracking cell population is much smaller than the main population, their statistics may not reflect the population shifts with sufficient accuracy. Nevertheless, it should be noted that tracking cells can be utilized in conjunction with the present invention for the advantages they provide.

Another approach is to minimize the likelihood of failure. For example, the sequence of bias conditions and ECC correction capabilities utilized during each iteration of read retries can be designed such that it will minimize the likelihood of ECC misdetection or miscorrection. This method may lead to long retry sequences, however, since typically the system tries the safest combinations first, and attempts the more powerful combinations that carry the most risk only after exhausting the earlier, safer retries. This is often not a robust solution, and it is best used in conjunction with a safeguard.

According to one aspect of the present invention, the storage system uses knowledge of the main cell population itself as a safeguard to avoid heroic recovery retries from biasing reads in the wrong direction. In a basic embodiment, the implementation relies on the fact that the expected disturb mechanism to be overcome will more frequently shift cells toward the more erased states, and hence the heroic recovery bias will always be in the direction of the more erased states. Upon detecting uncorrectable ECC error during nominal read, the system will perform a number of reads under biased conditions in small bias increments in the direction of the erased states, and count the number of cells in each state at each step. The system will then compare the number of cells that change states and determine the gradient or rate of change with each step. If it is determined that the rate of cells shifting from one population to the next increases with each step, then the discrimination point will be understood to be penetrating a cell population (e.g. penetrating population A in FIG. 1 when $V_{Br}$ is shifted too far negatively), in which case the system will not invoke Heroic Recovery.

As an additional safeguard, the system could perform a number of reads under biased conditions in the direction of the programmed states, and if it is determined that the rate of cells shifting from one population to the next is decreasing, the system would not invoke heroic recovery. Heroic recovery would only be invoked when all cell count-based conditions indicate it to be appropriate. An extension of this idea is to use the rate of change of cell populations to guide or limit the amount of bias during Heroic Recovery.

These concepts can be illustrated by returning FIG. 1. The degraded distributions of states A and B are shown schematically as the broken lines of distributions $D'_A$ and $D'_B$, and show significant spreading, particularly towards a less programmed (lower threshold voltage) condition. The goal is to determine the bias conditions or compare points at which to optimally read the B state with minimum risk of exacerbating existing error. The main discussion is given in terms of varying a voltage for the compare point for simplicity in illustration, in which case the question comes down to deciding what is the best compare voltage to be used to extract data.

As shown in FIG. 1, a fair amount of the $D'_B$ has shifted below $V_{Br0}$, the nominal read bias condition. If the number in error is not so great as to overwhelm the ECC, the data can be extracted based on this standard read. If the normal read is not successful, heroic measures can be taken. A number of secondary read points, in this example the three levels $V_{Br1}$, $V_{Br2}$, $V_{Br3}$, at progressively lower voltages are shown, associated with the heroic reads. Each of these will progressively correctly detect more of the B state cells that have shifted to lower voltages. However, beyond a certain point, these offset reads will begin to pick up outliers at the top end of the A state distribution. As shown in the figure, at $V_{Br2}$ the lowered read point is still largely confined to the bottom part of $D'_B$, whereas by $V_{Br3}$ it has begun to penetrate $D'_A$. (As shown in the detail, the number of states counted will be $(D'_A + D'_B)$, which begins to have a non-negligible contribution between $V_{Br3}$ and $V_{Br2}$.) Consequently, in this example the optimal read point is probably a little below $V_{Br2}$, but closer to $V_{Br2}$ than $V_{Br3}$. The present invention uses these different read points to determine the characteristics of the distribution and, according to various embodiments, to, in turn, determine which of these secondary read points is the best choice to either extract data or to establish a new read point at which to read the data content. In FIG. 1, the best choice of the secondary read points would be $V_{Br2}$, while in an embodiment that extrapolates or interpolates an optimal (to a required accuracy) read point, this would lie somewhat to the left of $V_{Br2}$.

Let $N_0$ be the number of states lying above $V_{Br0}$, $N_1$ be the number of states lying above $V_{Br1}$, $N_2$ be the number of states lying above $V_{Br2}$, and $N_3$ be the number of states lying above $V_{Br3}$. (Again, the number of secondary read points can vary according to the embodiment.) Note that the data content need not actually be extracted in these reads (and, if there is too much error, this may not even be possible), but only that the number of states lying above the read point need be determined. As exemplified in FIG. 1, each of these numbers becomes progressively largely; but the magnitude by which each of these increases (relative to the change in read parameter) becomes less as they move further into the tail of the distribution—at least until they begin to penetrate the upper end of the next lower state distribution. (Note that if the read points are not evenly spaced, this is preferably compensated for.) Consequently, the important quantity is the difference between the N values.

Calling the difference between N values $\Delta$, this gives $$(N_1 - N_0) = \Delta_{1,0},$$

with $\Delta_{2,1}$ and $\Delta_{3,2}$ similarly defined. Although the various Ns will pick up not just the cells in the B distribution but also any higher states, these higher states will not contribute to $\Delta_{1,0}$, since their contribution remains the same within each of the N values, and therefore will cancel out. Also, there is no need for an actual read of the data content or evaluation of ECC, since, at this point, the process is just trying to find the best (or sufficiently good) read point at which to perform this data extraction. In the example of FIG. 1, $\Delta_{1,0}$ will be larger than $\Delta_{2,1}$, so that a read point between $V_{Br2}$ and $V_{Br1}$ will be better than a read point between $V_{Br1}$ and $V_{Br0}$. How, with $\Delta_{3,2}$ slightly larger than $\Delta_{2,1}$, $V_{Br3}$ is likely to have begun encroaching upon the A distribution. Consequently, $V_{Br2}$ can used as the read point for data extraction or the values of $\Delta_{3,2}$ and $\Delta_{2,1}$ could be analyzed to determine a yet more optimal value. In one variation, additional reads of the region between $V_{Br2}$ and $V_{Br3}$ can be performed to refine the process. However, it is not necessary to find the best point, but merely one for which the data content can be extracted correctly. Consequently, the selected read point need not be the optimal point, but simply one of these same set of read points, as described above, which offers the best (lowest) value for $\Delta$. For example, the point $V_{Br2}$ is probably the best choice in FIG. 1 and can used to extract the data content. Alternatively, even though $\Delta_{1,0}$ is greater than $\Delta_{2,1}$ and, consequently, $V_{Br2}$ is better (in the sense correctly reading more cells) than $V_{Br1}$, if $\Delta_{1,0}$ is small enough (such as less than a bound that could, for example, be a settable parameter), $V_{Br1}$ could be selected for extracting the data.

Although the discussion here is in the context of find a read point to extract the data content, it can also be used to improve various data refresh or scrub methods, such as those found in U.S. Pat. No. 5,657,332, whose functions are not primarily to provide data for some external (end user/use) application, but rather to provided internal housekeeping functions, confined within the memory device, itself.

The discussion of the process thus far has been described mainly in terms of varying a compare or reference voltage to which the state of the memory cell is compared, since this is perhaps the easiest context in which to describe the invention with respect to FIG. 1. However, as is known in the art, keeping the read reference values the same and changing the bias on the cell being read can also accomplish this end, either independently of or used in conjunction with varying the reference point. In EEPROM and other charge storing transistor based memory technologies, this changing cell bias is typically done by varying the control gate voltage of the memory cell, although the level on the source, drain, or substrate (or even other transistors within, for example, the NAND string of the cell) can be varied as well. By way of example, the varying of reference levels as opposed to varying bias conditions is discussed with respect FIG. 6b as opposed to 6a of U.S. Pat. No. 5,657,332, where the reference parameter (or parameters) are current. Similarly, although the discussion of FIG. 1 was based on a voltage comparison, other parameters indicative of a cell's programming level (voltage, current, time, or frequency) can be used, as discussed in the various references explicitly cited herein. Furthermore, the required voltages, currents, and so on needed for bias levels, reference levels, or both can be generated by the various known techniques (reference cells, band gap based generators, etc.).

Further, the present techniques are not limited to only flash memories. A number of memories exhibit the characteristics described with respect to FIG. 1, such as the various nonvolatile memory devices described in U.S. patent publication US-2005-0251617-A1; consequently, the various aspects of the present invention has great utility for any of those technologies for which the distribution of programmed states has a tendency to degrade. It can also be applied to volatile memories that suffer from this sort of degradation due to leakage or other data draft (such as in a DRAM where there may be capacitor leakage) similar to that described with respect to FIG. 1. Also, as described above, although FIG. 1 shows only two states, the present invention is applicable not only to binary (where A and B are the only states) but also to multistate memories (where A and B represent two adjacent states of a multi-state memory).

In a typical embodiment of a memory device having a controller portion and a memory portion, this process would in most cases be managed via the controller, in a firmware implementation. In other embodiments it can be executed on the memory itself, should that memory unit have sufficient capability, or it can be distributed between the controller and memory portions. In still other embodiments, such as within memory cards lacking a full controller (e.g. xD cards or MemoryStick), some or all parts of the process can be managed by the host. For any of these variations, the different portions of the process can be implemented in hardware, software, firmware, or a combination of these.

Figure 2:
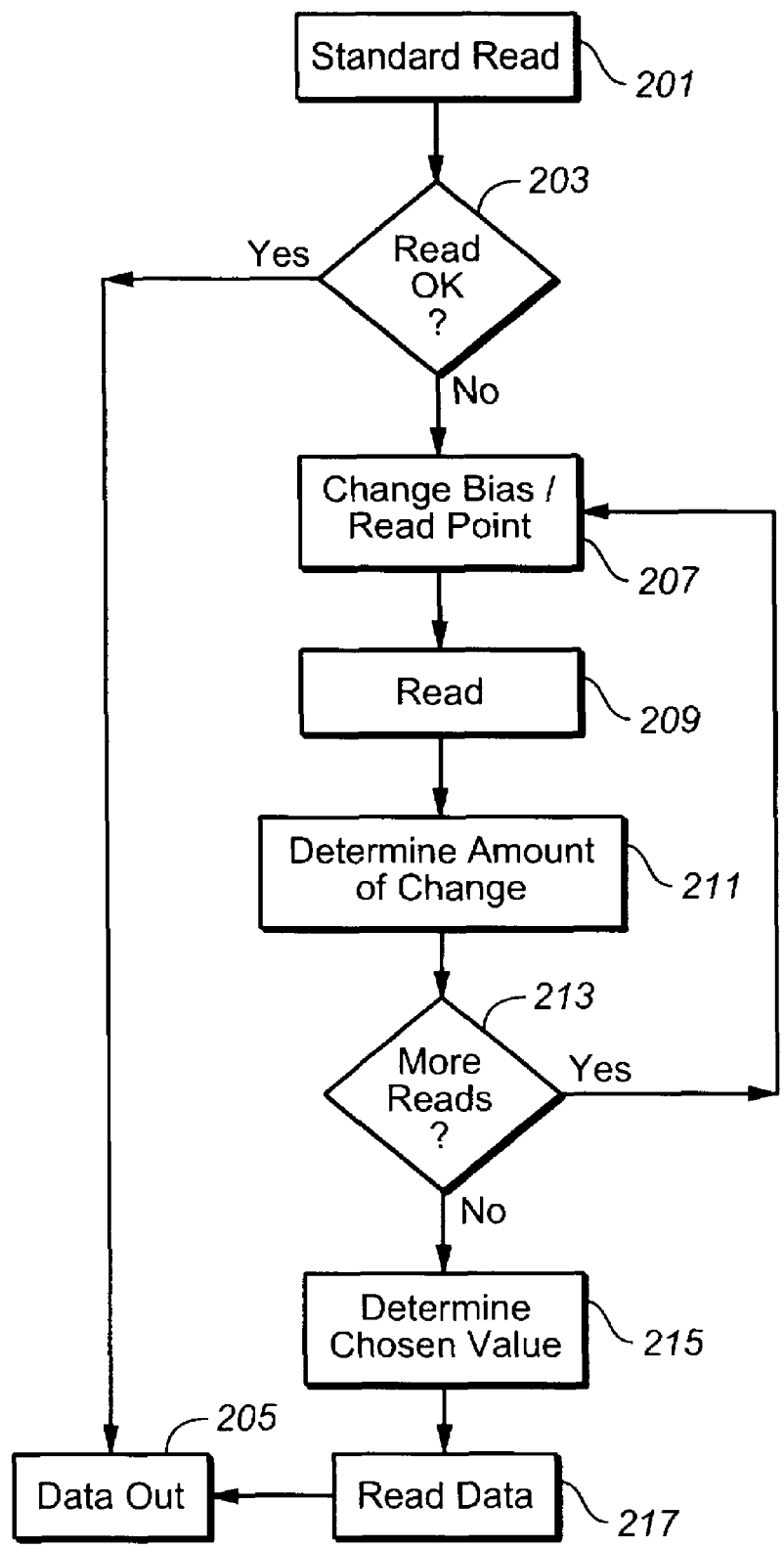
FIG. 2 is a flowchart illustrating aspects of the present invention.

FIG. 2 is a flowchart to illustrate some of the various aspects of the present invention. The process begins at step 201 when a standard read process, using the usual bias conditions and reference values, is performed. At step 203, it is determined whether the data content is successfully extracted from the memory cells. If the read is successful (Yes out of step 203), the data stored in the cells is sent out (205). For example, the memory may have some amount of error, but within the limits of the corresponding error correction code, in which case the data content can still be extracted. (If there is some amount of error, but the content can still be extracted, a scrub operation can optionally be performed.)

Should the read not be successful, for example returning an ECC uncorrectable error signal rather than the data, the process goes to the main aspects of the invention, beginning with step 207. In some embodiments, the process can jump directly from step 207 (eliminating test condition 203), where the preferred read conditions are determined as part of a standard sensing operation, or the invocation of the process beginning at step 207 may be due to other reasons than the determination at step 203, such as if a certain amount of time has elapsed since the last read or a large numbers of possibly disturbing operations have been previously executed. At step 207, the first of the secondary read conditions are established. These can differ from the normal read in a number of ways, which can be used individually or in combination. One of these is to shift the value of the read comparison parameter, such as the voltage, current, time, or other parameter value indicative of the state. (This is similar to what is shown in FIG. 6b of U.S. Pat. No. 5,657,332 for a current based comparison.) Another is to change the bias conditions on the cells being read. For the exemplary flash memory embodiment and other charge storing transistor embodiments, this is typically done by changing the control gate voltage applied to the cells (as in FIG. 6a of U.S. Pat. No. 5,657,332), although this can also be done using changes to the source/drain voltage levels, other gate levels in a NAND string, or other bias shifts instead of (or in addition to) altering the control gate level.

The secondary read is executed at step 209. In more basic implementations of Heroic Recovery, the data can be output at this point if the secondary read is successful. As noted above, this evaluation need not be a read in the full sense of extracting data, but only need count the number of cells that register above the compare point.

Some of the primary aspects of the present invention are found in steps 211, 213, and 215. At step 211, the change in the number of states read is determined at 211. This will compare, for example, the difference between the number of cells above a normal read parameter and the number of cells above a first secondary read parameter with the difference between the number of cells above the first secondary read parameter and the number of cells above a second secondary read parameter. As described above, this is done to determine characteristics of the distribution. For example, if only a few additional cells are picked up in going from the normal read to the first secondary read, but more additional cells are picked up in going from the first secondary read to a second secondary read, the read point or bias shift of the second secondary read has likely go too far and is penetrating into the distribution of the next data state.

At step 213 it is determined whether more secondary reads are to be executed. The number of secondary reads can either be a fixed value (for example, as a settable parameter) or can be determined based upon the results of the earlier reads. In the fixed value example, a parameter keeping track of the supplemental reads would be incremented at each iteration and step 213 would decide whether it has reached its limit. In embodiments using earlier evaluations, 213 could, for example, determine whether $\Delta$ has begun to increase. Even in embodiments that decide step 213 based on earlier reads, it may be useful to keep track of the number of iterations and set a maximum number of these. If more reads are to be executed, the flow loops back to step 207; if not, it goes to step 215.

In step 215, the read conditions at which the data will be extracted are determined. This may be one of the reads performed at step 209 or an additional read, in which case the additional read is executed at step 217. In either case, the data stored in the cells is sent out (205).

Therefore, the present examples are to be considered as illustrative and not restrictive, and the invention is not to be limited to the details given herein, but may be modified within the scope of the appended claims.

It is claimed:

1. In a memory device having a plurality of memory cells each storing one of at least two data states, a method of reading the memory cells to determine which of the memory cells contain data corresponding to a selected one of the data states, the method comprising:
   evaluating the memory cells at a first reference condition;
   evaluating the memory cells at a plurality of secondary reference conditions; and
   determining a read condition at which to determine the memory cells that contain data corresponding to said selected one of the data states based on comparing the number of memory cells evaluated at the first reference condition and the second reference conditions, wherein the read condition is determined based on the rate of change of number of memory cells evaluated at the plurality of reference conditions.

2. The method of claim 1, further comprising:
   determining whether the evaluation result at the first reference condition has unacceptable error, wherein said evaluating the memory cells at the plurality of secondary reference conditions is in response to the evaluation result at the first reference point having unacceptable error.

3. The method of claim 2, wherein said determining whether the evaluation result at the first reference condition has unacceptable error is based on an error correction code result.

4. The method of claim 1, wherein the determined read condition is one of said secondary reference conditions.

5. The method of claim 1, wherein the determined read condition is a reference condition other than one of said first and secondary reference conditions.

6. The method of claim 1, wherein the plurality of evaluation conditions use the same bias conditions, but differing reference points.

7. The method of claim 6, wherein said reference points are current levels.

8. The method of claim 6, wherein said reference points are voltage levels.

9. The method of claim 6, wherein said reference points are time values.

10. The method of claim 1, wherein the first reference condition is a first set of bias conditions and the plurality of secondary reference conditions are a plurality of secondary sets of bias conditions.

11. The method of claim 10, wherein the first set of bias conditions and the secondary sets of bias conditions are distinguished from each other by a differing control gate voltage.

12. The method of claim 1, wherein said memory cells are non-volatile memory cells.

13. The method of claim 12, wherein said memory cells are charge storing devices.

14. The method of claim 13, wherein said memory device is a flash memory.

15. The method of claim 1, wherein said memory device includes a memory containing the memory cells and a controller, wherein the determining a read condition is performed within the memory.

16. The method of claim 1, wherein said memory device includes a memory containing the memory cells and a controller, wherein the determining a read condition is performed by the controller.

17. The method of claim 1, wherein said first reference condition is established by one or more reference cells.

* * * * *